United States Patent
Yue et al.

(10) Patent No.: US 6,597,227 B1
(45) Date of Patent: Jul. 22, 2003

(54) SYSTEM FOR PROVIDING ELECTROSTATIC DISCHARGE PROTECTION FOR HIGH-SPEED INTEGRATED CIRCUITS

(75) Inventors: Chik Patrick Yue, Milpitas, CA (US); Siu-Weng Simon Wong, Palo Alto, CA (US); David Kuochieh Su, Mountain View, CA (US); William John McFarland, Los Altos, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 09/488,940

(22) Filed: Jan. 21, 2000

(51) Int. Cl.[7] .................................................. H02H 3/20
(52) U.S. Cl. ....................... 327/310; 327/311; 361/56; 361/91.1; 361/91.7
(58) Field of Search .................................. 327/309, 310, 327/311, 324; 361/56, 57, 91.1, 91.7

(56) References Cited

U.S. PATENT DOCUMENTS

| | | | | |
|---|---|---|---|---|
| 4,315,229 A | * | 2/1982 | Greaves et al. | 327/556 |
| 4,383,229 A | * | 5/1983 | Jones | 327/311 |
| 4,806,999 A | | 2/1989 | Strauss | |
| 4,958,255 A | | 9/1990 | Pritchard | 361/212 |
| 5,293,298 A | * | 3/1994 | Foglia | 361/113 |
| 5,357,397 A | | 10/1994 | Leary | |
| 5,469,107 A | * | 11/1995 | Kohno | 330/277 |
| 5,576,680 A | | 11/1996 | Ling | 336/200 |
| 5,578,860 A | * | 11/1996 | Costa et al. | 257/362 |
| 5,712,753 A | | 1/1998 | Yeh et al. | 361/56 |
| 5,715,127 A | | 2/1998 | Yu | 361/56 |
| 5,896,113 A | * | 4/1999 | O'Neill | 343/895 |
| 5,901,022 A | | 5/1999 | Ker | 361/56 |
| 5,917,220 A | | 6/1999 | Waggoner | 257/360 |
| 5,969,929 A | * | 10/1999 | Kleveland et al. | 361/111 |
| 6,005,756 A | * | 12/1999 | Lane | 361/58 |
| 6,014,066 A | * | 1/2000 | Harberts et al. | 361/782 |
| 6,057,714 A | * | 5/2000 | Andrys et al. | 327/105 |
| 6,091,595 A | * | 7/2000 | Sharpe-Geisler | 361/111 |
| 6,371,927 B1 | * | 4/2002 | Brune et al. | 600/549 |

FOREIGN PATENT DOCUMENTS

| | | |
|---|---|---|
| EP | 0478890 | 4/1992 |
| EP | 0741413 | 6/1996 |
| EP | 0851555 | 7/1998 |
| JP | 11067486 | 3/1999 |

OTHER PUBLICATIONS

J. Craninckx, et al, "A 1.8–GHz CMOS Low–Phase–Noise Voltage–Controlled Oscillator with Prescaler", IEEE Journal of Solid State Circuits, vol. 30, No. 12, Dec. 1995, pp. 1474–1482.

Chik P. Yue, "On–Chip Spiral Inductors For Silicon–Based Radio–Frequency Integrated Circuits", Technical Report No. ICL 98–087, Department of Electrical Engineering, Stanford University, Jul. 1998.

* cited by examiner

Primary Examiner—Terry D. Cunningham
(74) Attorney, Agent, or Firm—Pillsbury Winthrop LLP (57) ABSTRACT

An ESD protection circuit uses an inductor to create an electromagnetic resonance in conjunction with the load capacitance of a conventional ESD device. By properly tuning the resonance of this combination, the protective properties of the ESD device can be maintained while minimizing its capacitive load on the main circuit. The inductor can be interposed in various series configurations with the ESD device between the main circuit and a voltage rail; alternatively, the inductor can be connected in various configurations in parallel with the ESD device. The inductor may be implemented as an on-chip inductor using conventional IC fabrication technologies, or may be implemented using IC chip bonding wires as inductors.

11 Claims, 11 Drawing Sheets

SYSTEM FOR PROVIDING ELECTROSTATIC DISCHARGE PROTECTION FOR HIGH-SPEED INTEGRATED CIRCUITS

BACKGROUND OF THE INVENTION

1. Field of the Invention

The present invention is directed to electrostatic discharge protection for electronic circuits; more particularly, the invention is directed to electrostatic discharge protection for high-speed integrated circuits, i.e., integrated circuits handling signals having frequencies higher than electrostatic discharge transients.

2. Background of the Related Art

Advances in integrated circuit development continue to increase the density of circuit components that can be fabricated in an integrated circuit (IC) chip. In conjunction with this advance in miniaturization, critical dimensions of the IC such as minimum conductor-to-conductor spacing and layer thicknesses also have been reduced. In particular, insulating layers within the IC structure have become thinner, making ICs more susceptible to electrostatic discharge (ESD) pulses. The pulses are passed to the IC circuit from an input or output pin, and if not properly diverted could deliver a brief but highly destructive charge to the. IC circuitry.

Figure 1:
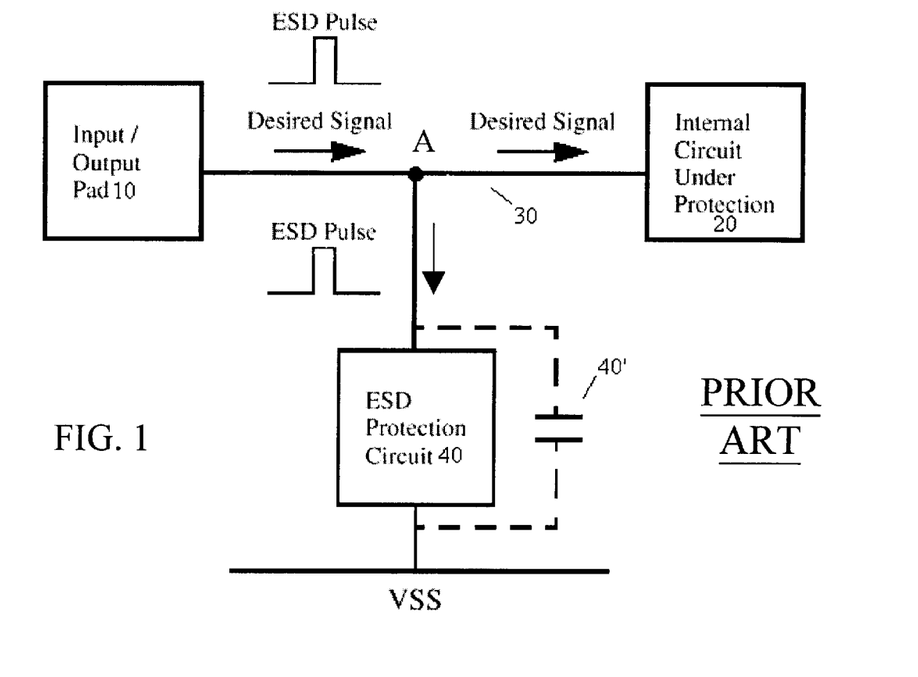

As is known in the art, ESD protection circuits can be fabricated in the ICs. Typically, these circuits are disposed on the input and output pads of the ICs and pass normal input signals therethrough while diverting ESD pulses as shown in FIG. 1. Here, an input or output bonding pad 10 of an IC is connected to an internal circuit 20 to be protected from ESD pulses via a conductor 30 (as used herein, "input/output bonding pad"denotes that the bonding pad may be used for receiving input signals, providing output signals, or both). Desired signals pass in one or both directions between the bonding pad I 0 and the internal circuit 20. Were the IC to have no ESD protection, an ESD pulse appearing at the bonding pad 10 would be conducted via conductor 30 to the internal circuit 20, possibly damaging or destroying it by, e.g., shorting through one or more oxide layers in the IC. However, ESD protection circuit 40 is activated by the relatively high voltage levels (relative to the IC's internal supply voltage) of the ESD pulses and establishes a low-resistance conductive path between conductor 30 and the ground connection to shunt the ESD pulse away from the internal circuit 20.

As one of ordinary skill in the art will recognize, in practice most protected circuits are equipped with not only one ESD protection circuit 40 between conductor 30 and system ground or $V_{SS}$, but also with another between conductor 30 and a positive source of potential, such as $V_{DD}$. This allows the ESD pulse to be discharged either through the $V_{SS}$ or $V_{DD}$ pad. However, FIG. 1 shows only a single ESD device 40 in the interests of simplicity and ease of explanation.

A typical ESD device 40 as described above is shown in FIG. 2. Here, an N-channel MOS transistor 50 is connected between conductor 30 and $V_{SS}$. A resistor 70 is connected between the gate of transistor 50 and $V_{SS}$. A capacitor 60 (which may be a parasitic capacitance of transistor 50 or a separate component) is connected between conductor 30 and the gate of transistor 50. Transistor 50 has a parasitic bipolar mode of operation designated by transistor 50'. The transistor 50 is very wide with a short channel length, e.g., 300 $\mu$m wide by 0.5 $\mu$m long, to be capable of efficiently shunting the current due to an ESD event (the current due to an ESD event is proportional to the amount of static charge deposited on the IC, and the current is typically between a few tenths of an ampere and a few amperes). By effectively choosing the values of capacitor 60 and resistor 70, the gate of transistor 50 will rise to a voltage of about 1 volt when an ESD event occurs and the voltage on node A rises above a trigger voltage of about 4.0 to 7.5 volts, depending on the IC fabrication technology in use. When the transistor 50 is turned on by such an ESD event, bipolar conduction through transistor 50' will begin and continue until the voltage on node A falls below the trigger voltage level.

Figure 2:
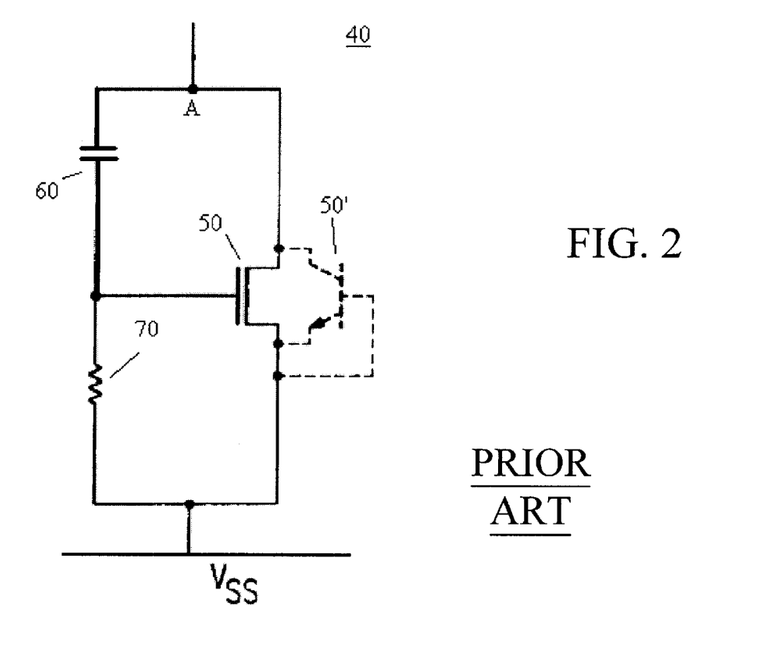
FIG. 2 is a schematic diagram of a typical ESD protection circuit used in the circuit of FIG. 1.

While this arrangement is workable in some applications, the ESD device 40 typically presents a relatively large capacitive loading 40' (on the order of a few picofarads) to the bonding pad 10 and internal circuit 20. This limits the maximum frequency of desired signals which can be exchanged between bonding pad 10 and internal circuit 20.

Prior art attempts at ameliorating this effect have reduced the size of the ESD protection transistor to lessen the capacitive loading to the IC; however, this necessarily reduces the level of protection afforded by the ESD protection circuit. As the frequency of signals processed by the IC increases, the ESD protection transistor becomes too small to be effective.

SUMMARY OF THE INVENTION

It is an object of the present invention to overcome the above shortcomings of the prior art.

It is another object of the present invention to provide a circuit for ESD protection which minimizes the capacitive loading on the inputs and outputs of the circuit which it protects.

It is a further object of the present invention to provide a circuit for ESD protection which is particularly useful with circuits processing high frequency signals.

It is still another object of the present invention to provide a circuit for ESD protection which provides effective ESD protection in high-frequency environments.

It is yet another object of the present invention to provide a circuit for ESD protection which provides effective ESD protection for circuits processing signals at frequencies above those of ESD pulses.

The above objects are achieved according to a first aspect of the present invention by providing an ESD protection circuit which uses an inductor to create an electromagnetic resonance in conjunction with the load capacitance of a conventional ESD device. By properly tuning the resonance of this combination, the protective properties of the ESD device can be maintained while isolating its capacitive load on the main circuit when presented with desired signals which are higher in frequency than ESD pulses. The inductor can be interposed in various series configurations with the ESD device between the main circuit and a voltage rail; alternatively, the inductor can be connected in various configurations in parallel with the ESD device. The inductor may be implemented as an on-chip inductor using conventional IC fabrication technologies, or may be implemented using IC chip bonding wires.

BRIEF DESCRIPTION OF THE DRAWINGS

These and other objects, features and advantages of the present invention are better understood by reading the following detailed description of the preferred embodiment, taken in conjunction with the accompanying drawings, in which:

FIG. 1 shows a basic ESD-protected integrated circuit according to the prior at

DETAILED DESCRIPTION OF PRESENTLY PREFERRED EXEMPLARY EMBODIMENTS

Figure 3:
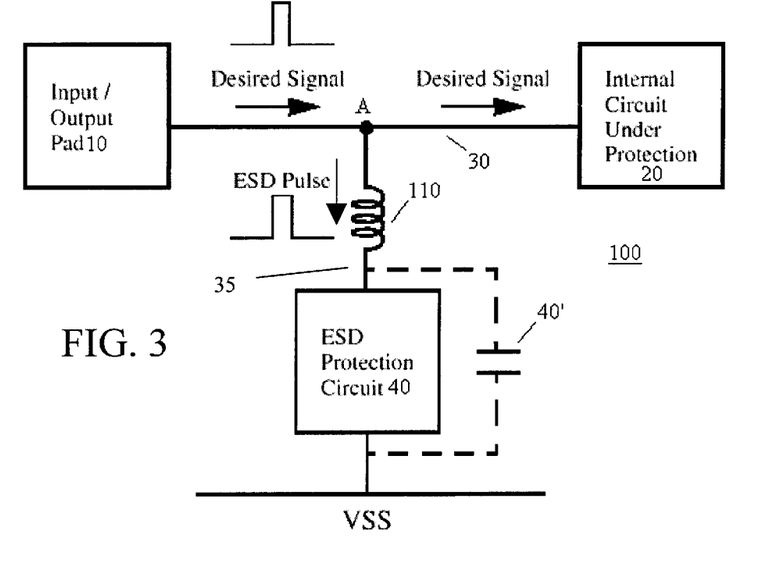
FIG. 3 shows an ESD-protected integrated circuit according to a first preferred embodiment of the present invention as used in an ESD protection scheme to ground.

A basic ESD-protected circuit 100 is shown in FIG. 3. This circuit is similar to the prior art circuit of FIG. 1 in that it includes a bonding pad 10 connected to an internal circuit 20 via a conductor 30, with an ESD protection circuit 40 between the conductor 30 and $V_{SS}$. However, in the first embodiment, an inductor 110 is connected in series between the conductor 30 and the ESD protection circuit 40 via another conductor 35.

Collectively, the inductor 110 and the ESD protection circuit 40 form an ESD protector. It should be noted that although FIG. 3 shows an ESD protector having the inductor 110 connected to the conductor 30 and the ESD protection circuit 40 connected to $V_{SS}$, the invention is not so limited, and the ESD protector may have an "inverted" configuration in which the ESD protection circuit 40 is connected to the conductor 30 and the inductor 110 is connected to $V_{SS}$.

Figure 4:
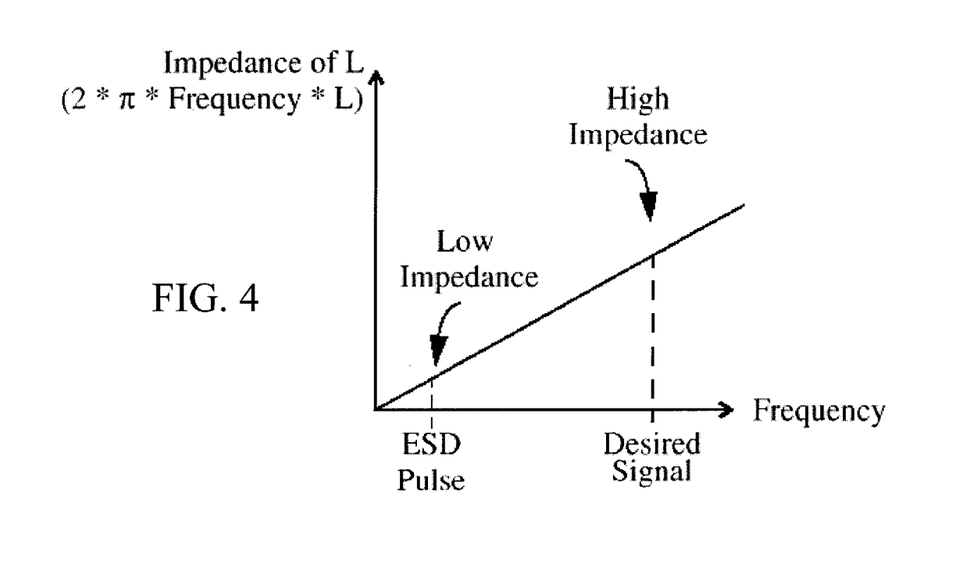
FIG. 4 is a graph showing impedance characteristics of an inductor in the first embodiment with respect to ESD pulses and higher-frequency desired signals.

As shown in FIG. 4, the impedance of an inductor is directly proportional to the frequency of the signal passing therethrough. Thus, through proper selection of the inductance of inductor 110, it will appear as a low-impedance link between conductor 30 and ESD protection circuit 40 at relatively low frequencies such as those of ESD pulses, and as a high-impedance link between conductor 30 and ESD protection circuit 40 at relatively high frequencies such as those of signals desired to be processed or output by the internal circuit 20. In this way, the inductor 110 effectively acts as a "switch", connecting conductor 30 to ESD protection circuit 40 and allowing the protection circuit 40 to perform its shunting function when the inductor 110 is presented with a relatively low frequency pulse such as an ESD pulse, and disconnecting conductor 30 from ESD protection circuit 40 to effectively eliminate the capacitive load of the protection circuit 40 when the inductor 110 is presented with a relatively high frequency pulse such as signals which are desired to be processed or have been processed by the internal circuit 20.

For example, consider an ESD-protected circuit on an IC 100 according to the first embodiment which processes high-frequency radio waves. In this case, the typical frequency of a desired signal might be on the order of several gigahertz. In contrast, the highest significant frequency component in an ESD pulse is typically on the order of 100 MHz. In this case, the value of the inductor 110 can be selected to pass signals at 100 MHz and below to the ESD protection circuit 40 while blocking signals at, e.g., 1 GHz and higher from reaching the ESD protection circuit 40.

Figure 5:
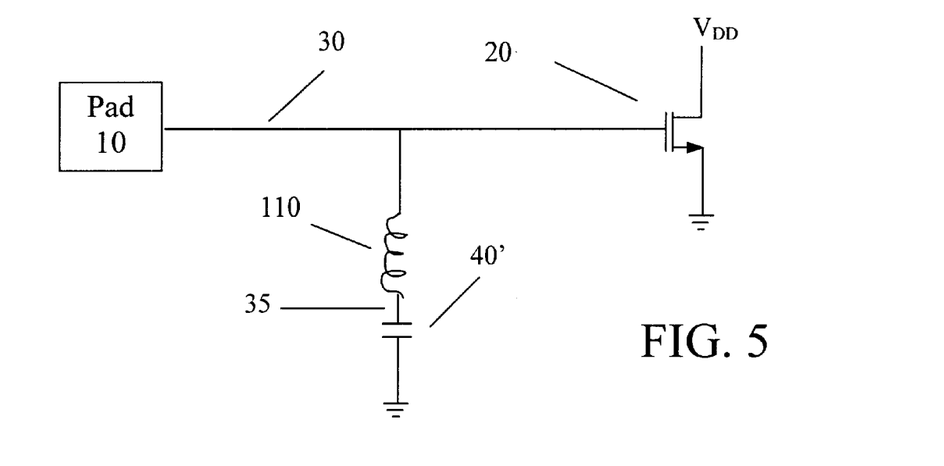
FIG. 5 shows an effective circuit of the first embodiment.

The method for selection of the proper inductance for use in the embodiment will be understood as follows. The impedance of the circuit 100 as seen by signals applied to input/output pad 10 can be modeled by the circuit of FIG. 5. Setting L as the inductance of inductor 110, $C_p$ as the capacitance of the parasitic capacitor 40' formed by ESD protection circuit 40, and $C_{in}$ as the effective capacitance of the internal circuit 20 (depicted in FIG. 5 as a single transistor for simplicity), with ω being the angular frequency of the input signal, the admittance of the inductor 110 is $$\frac{1}{j\omega L},$$

the admittance of the parasitic capacitor 40' is $j\omega C_p$, and the admittance of the internal circuit 20 capacitance is $j\omega C_{in}$. Then, the admittance Y looking in from input/output pad 10 is $$Y = j\omega C_{in} + j\omega C_p \mathbin{/\mkern-6mu/} \frac{1}{j\omega L} \qquad (1)$$

$$= j\omega C_{in} + \frac{j\omega C_p \frac{1}{j\omega L}}{j\omega C_p + \frac{1}{j\omega L}}$$

$$= j\omega C_{in} + \frac{j\omega C_p}{1 - \omega^2 L C_p}$$

$$= j\omega \left( C_{in} + \frac{C_p}{1 - \omega^2 L C_p} \right) = j\omega C_{\mathit{eff}}$$

where $C_{\mathit{eff}} = C_{in} + \dfrac{C_p}{1 - \omega^2 L C_p}.$

Figure 6:
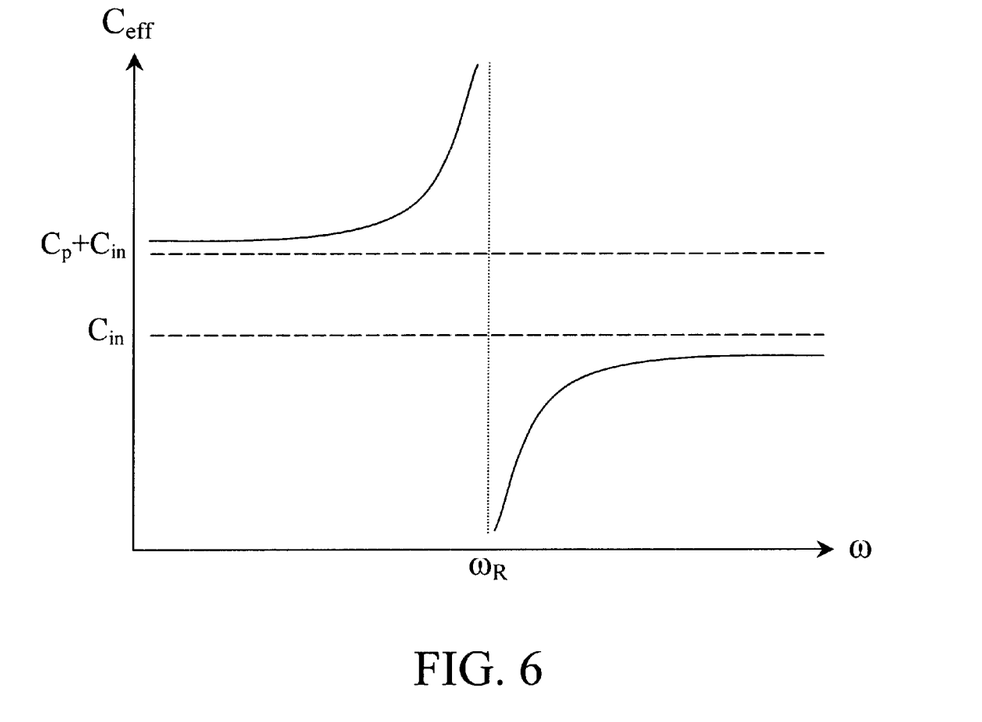
FIG. 6 shows resonance characteristics of the circuit of the first embodiment.

From this, one can see that a plot of the effective capacitance $C_{\mathit{eff}}$ versus frequency ω has a shape similar to that shown in FIG. 6. As can be seen in the Figure, there is a resonance at a frequency $\omega_R$ which causes the denominator of Equation 1 to go to 0, i.e., $$1 - \omega_R^2 L C_p = 0$$

or $$\omega_R = \frac{1}{\sqrt{LC_p}} \quad (2)$$

One can also see that on the low side of the resonance frequency $\omega_R$, the effective capacitance $C_{eff}$ approaches $C_{eff}=C_p+C_{in}$, and on the high side of the resonance frequency $\omega_R$, the resonance frequency $C_{eff}$ asymptotically approaches the dalue $C_{eff}=C_{in}$. Since the parasitic capacitance $C_p$ of the ESD protection circuit 40 is generally a factor of five or more greater than that of the effective input capacitance of the internal circuit 20, e.g., about 3 pF versus 0.5 pF, it is preferable that the inductance L of the inductor 110 is selected so that high frequency signals $\omega_{HF}$ to be processed by the internal circuit 20 fall well to the right of $\omega_R$ to minimize the effective capacitive loading; that is, $\omega_R<<\omega_{HF}$; practically, say, $$\omega_{HF} 5 \omega_R \quad (2)$$

so that $C_{eff} \rightarrow C_{in}$.

For a desired frequency band centering at $\omega_{HF}=2\pi(2.5\times 10^9)$ rad/sec and $C_p=3$ pF, for example, from Equations (3) and (2), $\omega_{HF}=5\omega_R$ $$2\pi \times 2.5 \times 10^9 = 5 \frac{1}{\sqrt{L(3 \times 10^{-12})}}; \text{ thus,}$$

L=33.8 nH

To make use of a smaller on-chip inductor to conserve space, a lesser multiple such as $\omega_{HF}=3 \omega_R$ might be used, in which case L=12.2 nH.

Figure 7:
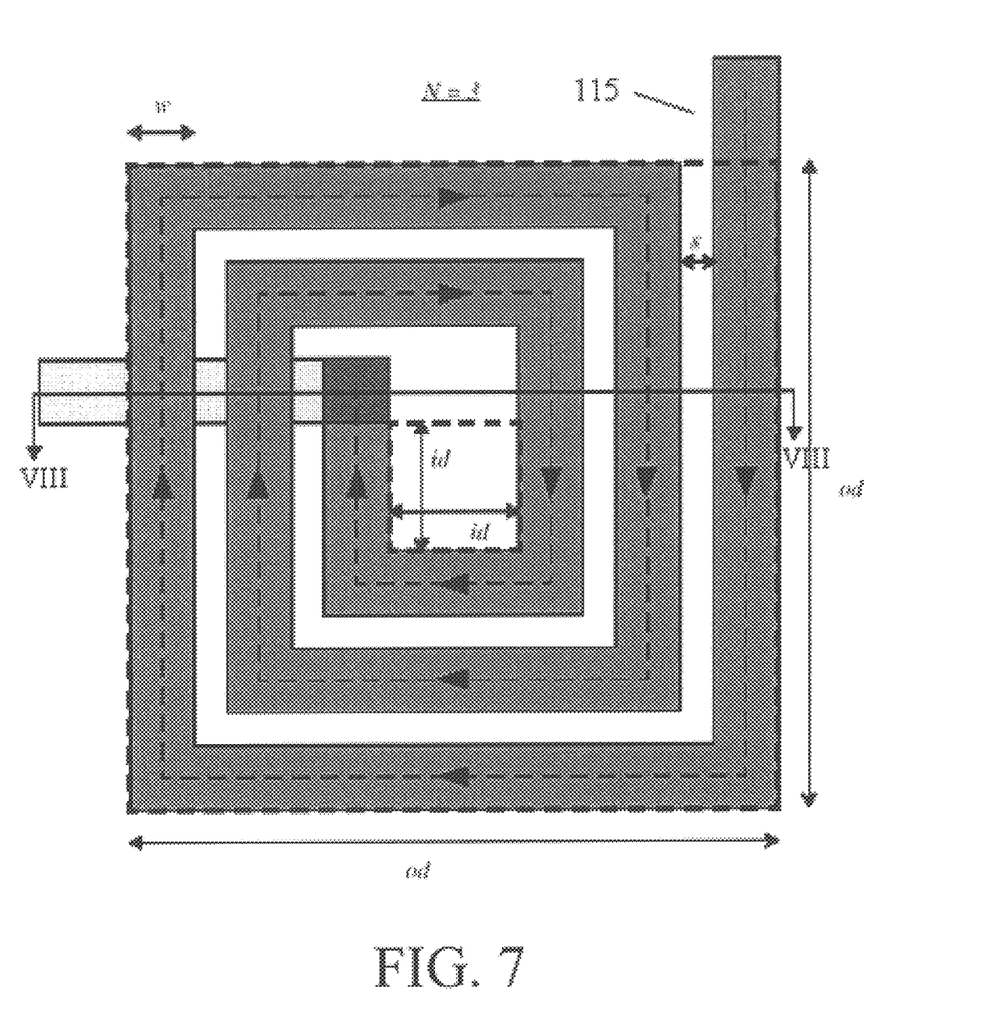
FIG. 7 shows a planar spiral inductor suited to fabrication in an integrated circuit for use in the first embodiment.
Figure 8:
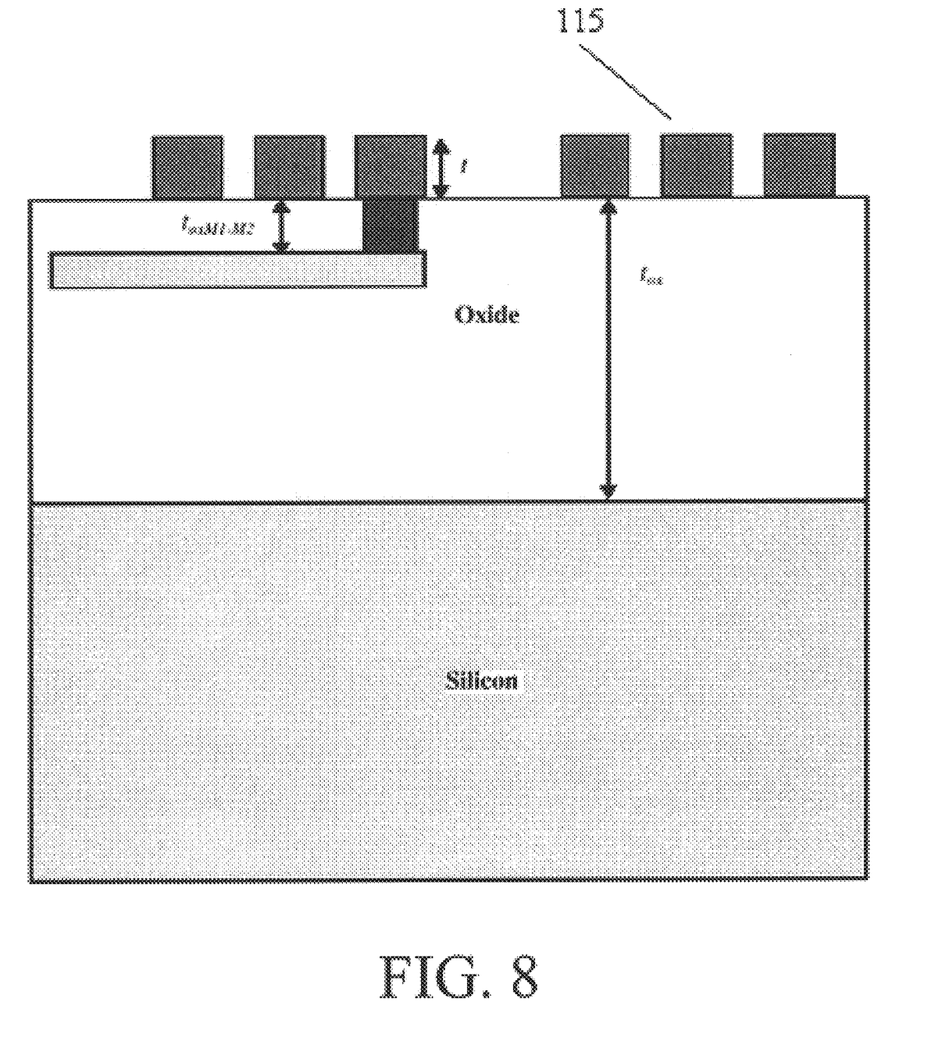
FIG. 8 is a cross-sectional diagram of the inductor of FIG. 7 taken along line VIII—VIII therein.

The inductor 110 can be fabricated in the IC 100 in several ways. One is to use the inherent inductance of chip bonding wires, as will be described in greater detail below. Another is to form an inductor in the IC 100 itself. FIG. 7 shows the top view of an on-chip planar spiral inductor of this type, and FIG. 8 is a cross-section of the inductor 110 taken through the thickness of the IC 100. By selecting the number N of inductor turns, the width w of the inductor trace 115, the thickness t of the inductor trace 115, the space s between inductor turns, as well as the inner diameter id and the outer diameter od of the inductor, an appropriate inductance can be selected for inductor 110 to match the loading capacitance of the ESD protection circuit 40. Further details may be found in Yue, "On-Chip Spiral Inductors for Silicon-Based Radio-Frequency Integrated Circuits", Technical Report No. ICL98-087, Stanford University PhD. Dissertation, incorporated herein by reference.

Figure 9:
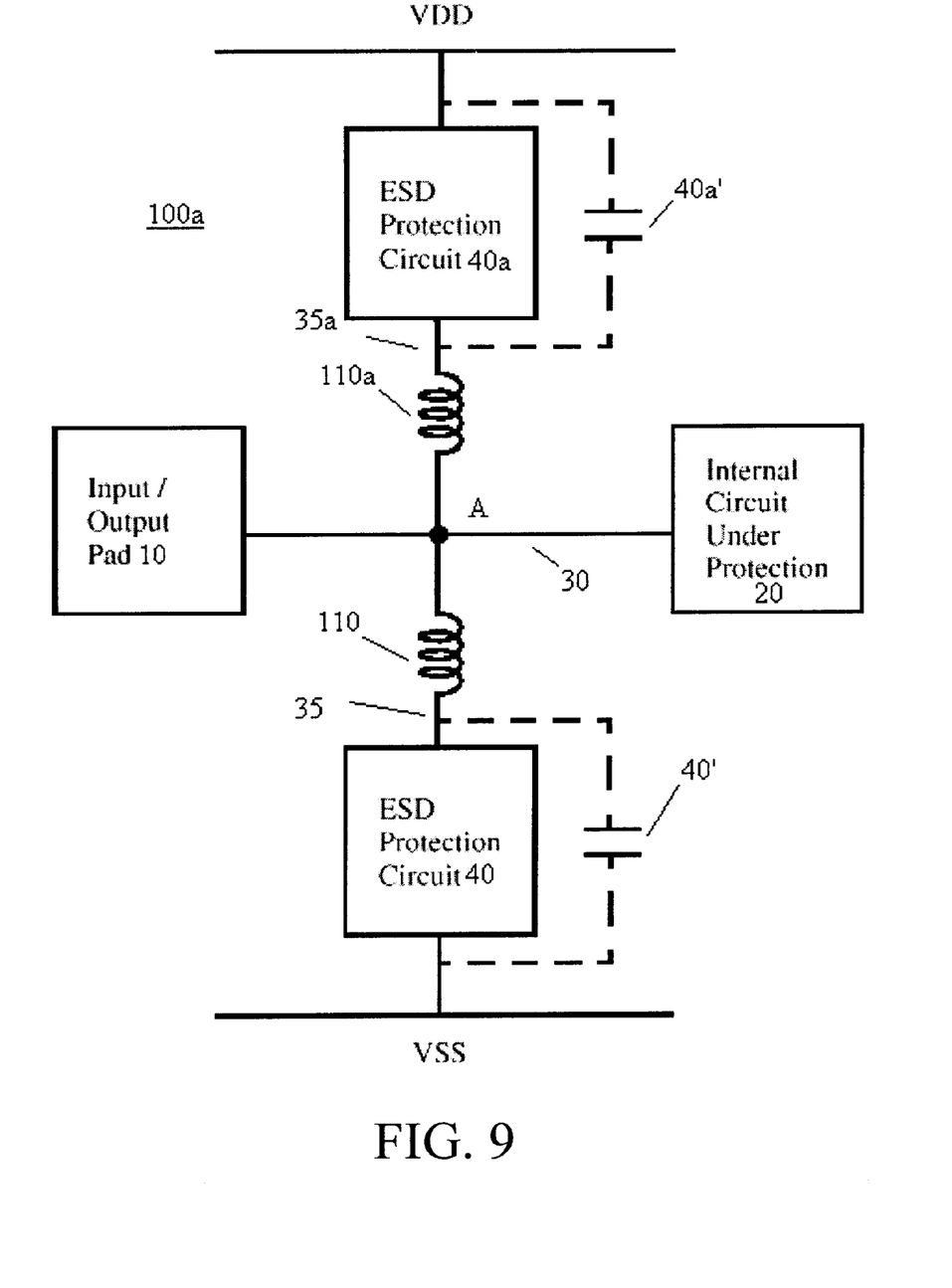
FIG. 9 shows an ESD-protected integrated circuit according to a variation of the first embodiment as used in an ESD protection scheme to both the power supply ($V_{DD}$) and ground ($V_{SS}$)

As shown in FIG. 9, the conductor 35 is a dedicated conductor connecting the inductor 110 to the ESD protection circuit 40; however, to minimize the size and wiring complexity of the circuit, the conductor 35 may be a system bus line such as the $V_{DD}$ line or any other similar connection higher in potential than $V_{SS}$.

Similar to the prior art circuit shown in FIG. 1, the version of the first embodiment shown in FIG. 3 provides ESD protection between the input/output pad 10 and ground. A more typical implementation of the embodiment is shown in FIG. 9, where as before in an IC 100a, a bonding pad 10 is connected to an internal circuit 20 to be protected by a conductor 30, with an ESD protector formed by inductor 110 and ESD protection circuit 40 in series between the conductor 30 and $V_{SS}$. This version of the embodiment, however, also includes another ESD protector formed by inductor 100a connected to an ESD protection circuit 40a (presenting a capacitive load 40a'), the series combination of which connects the conductor 30 to $V_{DD}$. Thus, while the ESD protector formed by the combination of inductor 110 and ESD protection circuit 40 can protect internal circuit 20 from ESD pulses with respect to $V_{SS}$, the ESD protector formed by the combination of inductor 110a and ESD protection circuit 40a can protect internal circuit 20 from ESD pulses with respect to $V_{DD}$. In both cases, higher-frequency desired signals are passed to the internal circuit 20.

Calculation of appropriate inductances L for the inductors 110 and 110a are substantially similar to the process described above.

Figure 10:
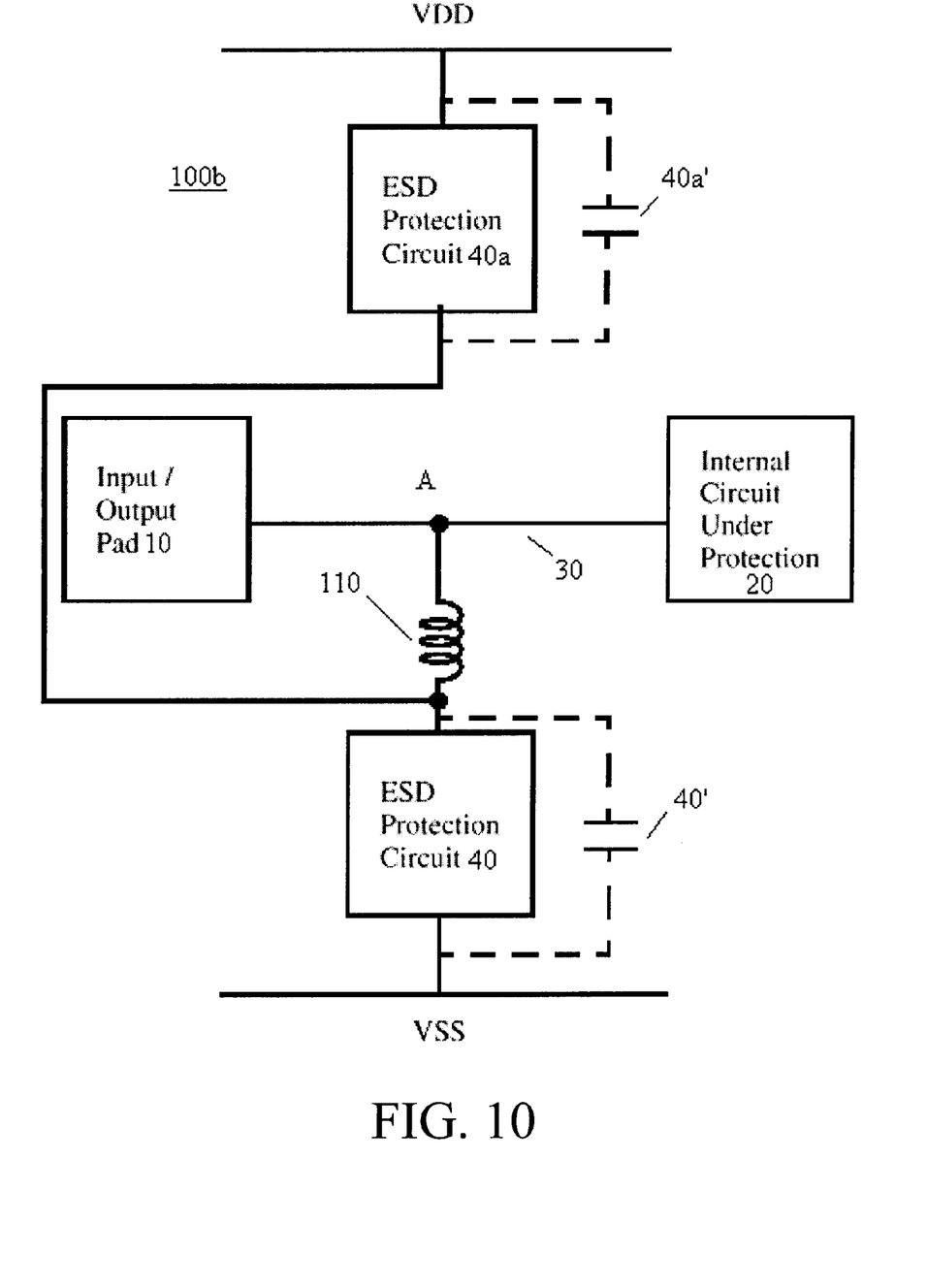
FIG. 10 shows an ESD protection circuit according to another variation of the first embodiment as used in an ESD protection scheme to both $V_{DD}$ and $V_{SS}$.

In another variation of the first embodiment shown in FIG. 10, in an IC chip 100b the second ESD protection circuit 40a is connected to the inductor 110 of the ESD protector not at node A on its bonding pad-internal circuit side; rather, the second ESD protection circuit 40a is connected to the inductor 110 on the same side as the first ESD protection circuit 40. This arrangement has an effect similar to the above in that when the ESD pulse appears between the bonding pad 10 and $V_{SS}$, it is transmitted via conductor 30 through inductor 110 and ESD protection circuit 40 to $V_{SS}$; when the ESD pulse appears between the bonding pad 10 and $V_{DD}$, it is transmitted via conductor 30 through inductor 110 and ESD protection circuit 40a to $V_{DD}$. Again, higher-frequency desired signals are passed to the internal circuit 20. In this way, the variation of the first embodiment shown in FIG. 10, can achieve effects similar to those provided by the variation shown in FIG. 9 while requiring the use of only one inductor 110.

The calculation of an appropriate inductance value for inductor 110 is similar to that of the first embodiment above; however, when determining the effective impedance looking in from the input/output pad 10, the parasitic capacitance 40a' of the ESD protection circuit 40a will appear in parallel with the parasitic capacitance 40' of the ESD protection circuit 40, resulting in $$C_{eff} = \frac{2C_p}{1 - 2\omega^2 LC_p}.$$

Figure 11:
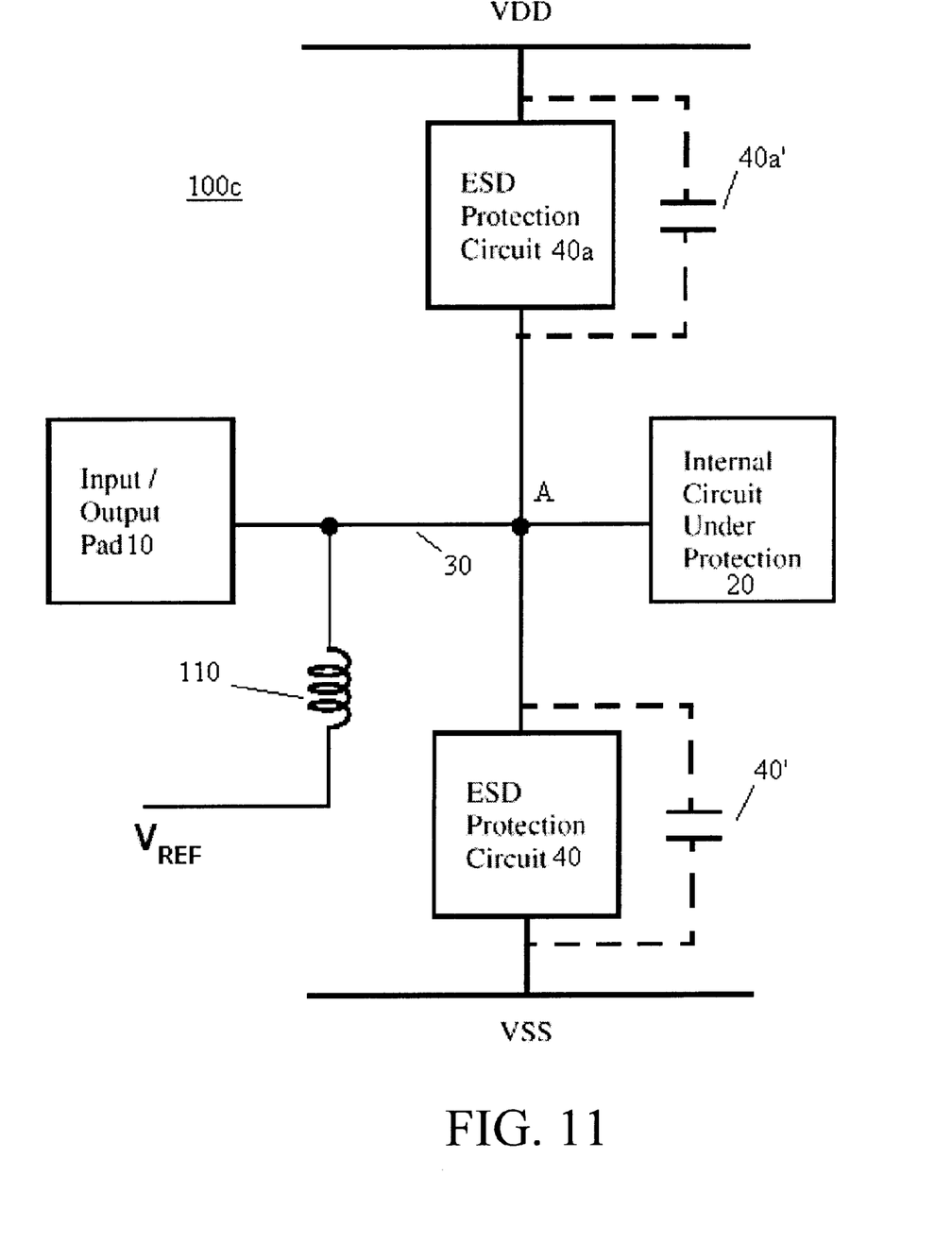
FIG. 11 shows an ESD protection circuit according to a second preferred embodiment of the present invention as used in an ESD protection scheme to both the power supply and ground.

FIG. 11 shows a third preferred embodiment of the present invention in which the ESD protection circuits 40 and 40a are connected directly to conductor 30, and thus to input/output pad 10 and internal circuit 20, rather than connecting through inductor 110. Inductor 110 is connected to conductor 30 and to a voltage reference $V_{REF}$ which may be at any potential other than $V_{SS}$.

Figure 12:
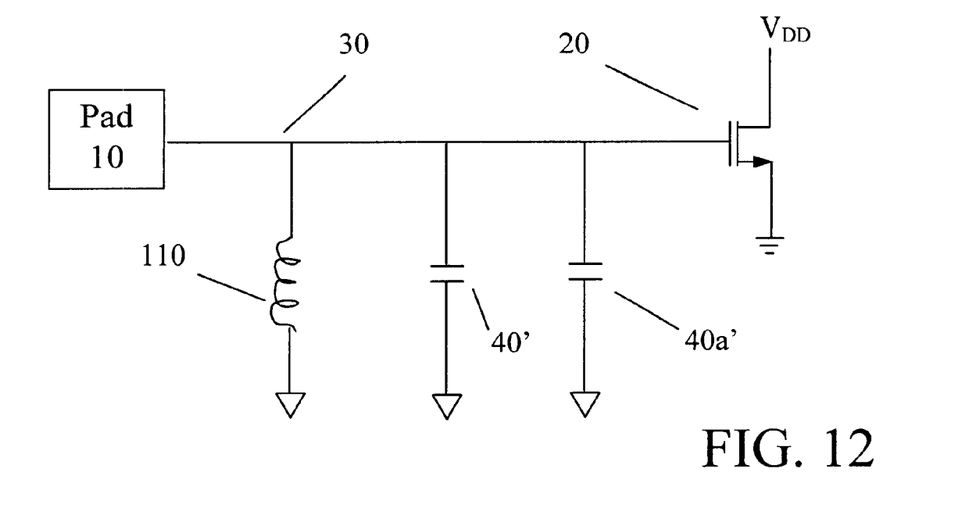
FIG. 12 shows an effective circuit of the circuit of the second embodiment.

Selection of the inductance of inductor 110 is developed as follows. Similar to the first embodiment, the effective circuit seen from the input/output pad 10 of the third embodiment is shown in FIG. 12 (in the Figure, $V_{REF}$ and $V_{SS}$ are shown as high-frequency grounds). The admittance of the circuit, then, is $$Y = j\omega C_{in} + j\omega C_p + j\omega C_p + \frac{1}{j\omega L}$$

-continued $$= j\omega\left(C_{in} + 2C_p - \frac{1}{\omega^2 L}\right) = j\omega C_{eff}$$

Therefore, for this embodiment $$C_{eff} = C_{in} + 2C_p - \frac{1}{\omega^2 L} \quad (4)$$

and the parasitic load of the ESD protection circuit can be minimized by attempting to choose a value for L which cancels out the $C_p$ component. That is, assuming the values and frequencies of the first embodiment apply here, $$2(3 \times 10^{-12}) = \frac{1}{(2.5 \times 10^9)^2 L}$$

or

L=26.7 nH.

It should be noted that although in the first embodiment one objective in choosing the inductance L was to place the high frequency signals to be processed $\omega_{HF}$ far to the right of the resonant frequency $\omega_R$ on the graph of FIG. 6, this embodiment does not exhibit the same type of transfer characteristic, the same consideration is not present. Rather, as noted above, the main consideration is to choose L to cancel the parasitic capacitances $C_p$ of the ESD protection circuits 40 and 40a.

Figure 13:
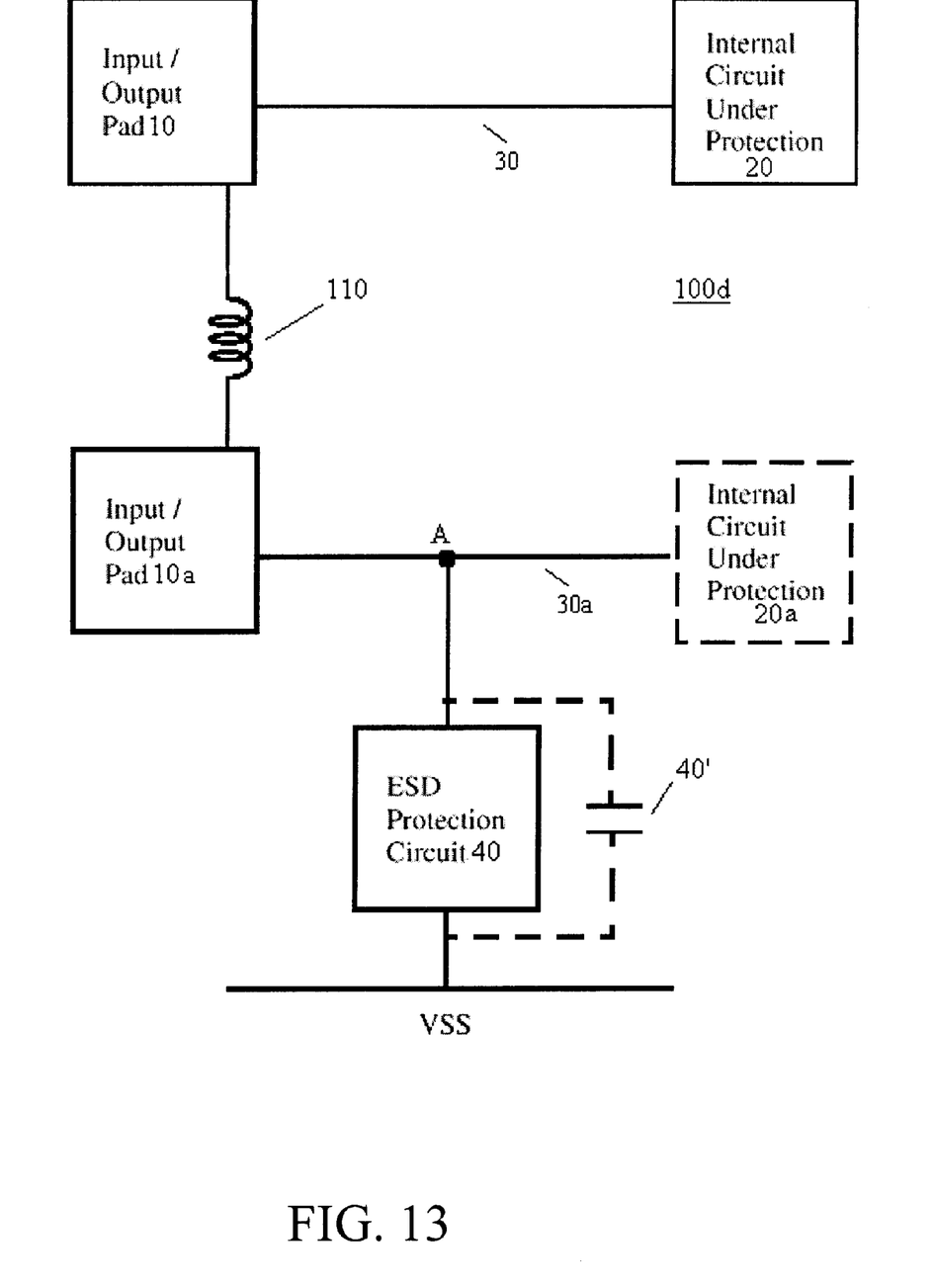
FIG. 13 shows an ESD protection circuit according to a third preferred embodiment of the present invention as used in an ESD protection scheme to the ground.

FIG. 13 shows a third preferred embodiment of the present invention which is particularly suited to implementation of the inductor 110 using bonding wire inductance as mentioned above. Here, inductor 110 is not connected between the conductor 30 and the ESD protection circuit 40; rather, it is connected between the bonding pad 10 and another bonding pad 10a on the IC chip 100d. The bonding pad 10a is connected via a conductor 30a to the ESD protection circuit 40.

In this embodiment, when an ESD pulse appears at bonding pad 10, it is transmitted through inductor 110, bonding pad 10a and conductor 30a to the ESD protection circuit 40 which shunts the pulse to $V_{SS}$. In this way, the impedance of the inductor 110 can compensate for the characteristic capacitance 40' of the ESD protection circuit 40 while passing higher frequency desired signals to the internal circuit 20 generally as described above in connection with the first embodiment.

Similarly, if an ESD pulse appears at bonding pad 10a, it will be shunted to $V_{SS}$ by the ESD protection circuit 40; however, inductor 110 will not be included in this signal path, and the capacitance 40' of ESD protection circuit 40 will not be compensated for ESD pulses appearing on bonding pad 10a. Thus, in this embodiment bonding pad 10a should be used for transmitting and receiving desired signals which have lower frequencies and for which such compensation is not necessary in connection with circuit 20a which may or may not be part of the same functional circuit as circuit 20. Additionally, circuit 20a need not be provided at all.

Calculation of an appropriate inductance for the inductor 110 is substantially the same as in the first embodiment described above.

Figure 14:
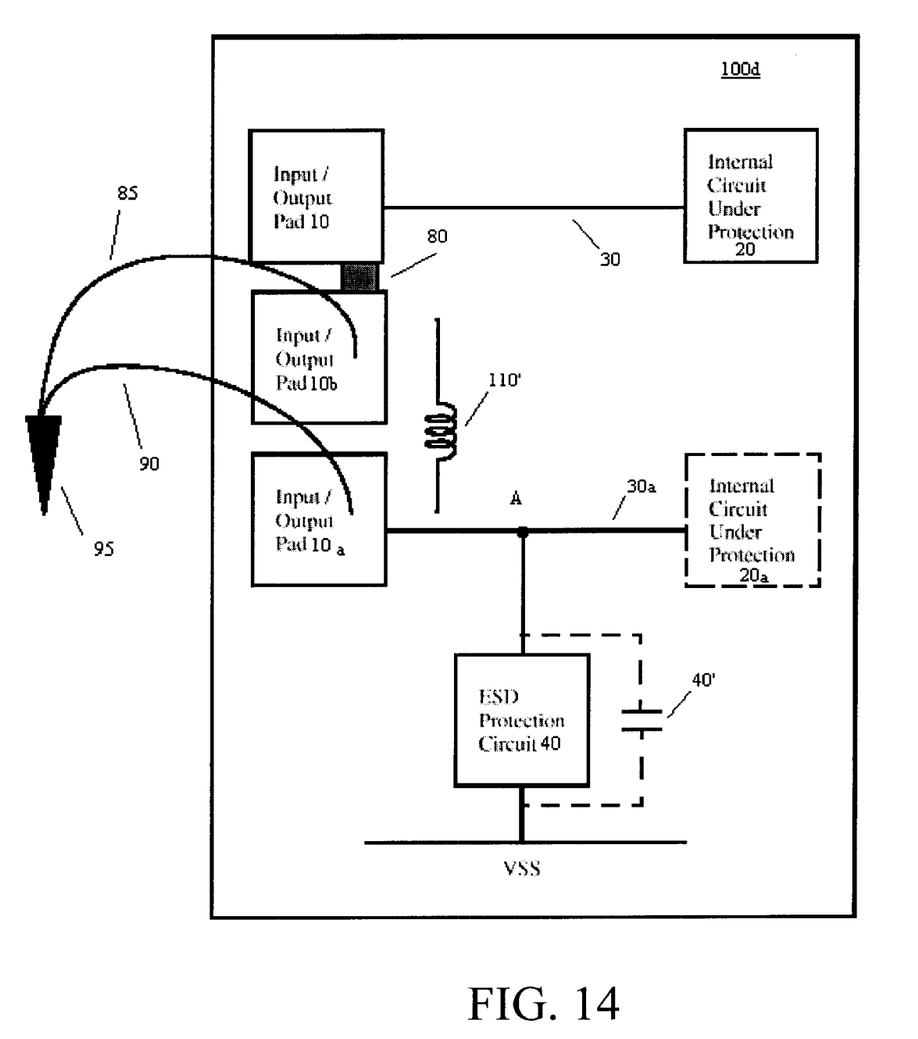
FIG. 14 shows implementation of the inductor in the third embodiment.

FIG. 14 shows another way of implementing the embodiment of FIG. 13 using bonding wire inductors. Here, the inductor 110' connecting bonding pads 10a and 10b is primarily formed by two bonding wires 85 and 90 connected to an IC package pin 95. One bonding wire 90 is connected to bonding pad 10a, while the other bonding wire 85 is connected to an auxiliary bonding pad 10b. The auxiliary bonding pad 10b is electrically connected to bonding pad 10 by an on-chip interconnection 80. In this way, the inherent inductance of the bonding wires 85 and 90 (typically 1 nH per millimeter of wire) provide the necessary inductance to form inductor 110' compensating for the capacitance of ESD protection circuit 40. As above, circuit 20a may or may not be part of the same functional circuit as circuit 20 and need not even be used.

The use of inductive bonding wires instead of an on-chip inductor to form the inductor 110' provides lower series resistance for the inductor and consequent lower loss at radio frequencies. It also consumes less space on the IC chip 100d. However, unlike the on-chip inductor, the bonding wire arrangement requires additional bonding pads (for the auxiliary bonding pads 10a and 10b) and sometimes additional package pins. Also, it should be noted that although the bonding wire arrangement has been disclosed in connection with this embodiment, one of ordinary skill in the art will recognize that it is readily applicable to the other embodiments disclosed herein. Further, one of ordinary skill will readily recognize that this embodiment may be implemented using on-chip inductors as well. Additionally, implementations other than those above are possible; for example, the embodiment of FIGS. 13 and 14 may be equipped with an additional ESD protection circuit connected to conductor 30a, and the embodiment of FIG. 11 can be used with only one ESD protection circuit 40.

The present invention has been described above in connection with a preferred embodiment thereof; however; this has been done for purposes of illustration only, and the invention is not so limited. Indeed, variations of the invention will be readily apparent to those skilled in the art and also fall within the scope of the invention.

What is claimed is:

1. An electrostatically protected circuit comprising:
   an internal circuit electrically connected to a pad; and
   an ESD protector, including an electrostatic protection circuit in series with an inductor, having a first terminal electrically connected to the pad and internal circuit and a second terminal electrically connected to an exit path for electrostatic discharge pulses appearing at the pad, wherein said inductor is electrically connected to the electrostatic protection circuit via an additional pad, wherein the inductor comprises:
      a first bonding wire having first and second ends respectively electrically connected to the additional pad and to a package pin; and
      a second bonding wire having first and second ends respectively electrically connected to an auxiliary pad and to the package pin, and
   wherein the electrostatically protected circuit further comprises an on-chip interconnect electrically connecting the first pad and the auxiliary pad.

2. The electrostatically protected circuit of claim 1, wherein the inductor has an inductance selected to effectively pass signals having frequencies typical of electrostatic discharge pulses and to effectively block signals having frequencies typical of signals desired to be processed by the internal circuit.

3. The electrostatically protected circuit of claim 1, wherein the inductor has an inductance selected to effectively pass signals near a first frequency and to effectively block signals near a second frequency higher than the first frequency.

4. The electrostatically protected circuit of claim 1, wherein the inductor has an inductance selected to compensate for a characteristic capacitance of the electrostatic discharge protection circuit at frequencies typical of signals desired to be processed by the internal circuit.

5. The electrostatically protected circuit of claim 1, further comprising:
   an additional ESD protector, including an electrostatic protection circuit in series with an inductor, having a first terminal electrically connected to the pad and internal circuit and a second terminal electrically connected to an additional exit path for electrostatic discharge pulses appearing at the pad.

6. The electrostatically protected circuit of claim 1, further comprising an additional electrostatic protection circuit having a first terminal electrically connected between the electrostatic protection circuit and the inductor of the ESD protector and a second terminal electrically connected to an additional exit path for electrostatic discharge pulses appearing at the pad.

7. The electrostatically protected circuit of claim 1, wherein the inductor is implemented on an integrated circuit chip.

8. The electrostatically protected circuit of claim 1, wherein the inductor is implemented with integrated circuit bonding wire.

9. The electrostatically protected circuit of claim 1, further comprising an additional internal circuit electrically connected to the second terminal of the inductor, the additional pad and the electrostatic protection circuit.

10. An electrostatically protected circuit comprising:
    an internal circuit electrically connected to a pad;
    an additional pad;
    an ESD protector, including an electrostatic protection circuit in series with an inductor, the electrostatic protection circuit having a first terminal electrically connected to the additional pad and a second terminal electrically connected to an exit path for electrostatic discharge pulses appearing at the pad, and wherein the inductor is electrically connected to the electrostatic protection circuit between the pad and the additional pad; and
    an additional ESD protector, including an additional electrostatic protection circuit in series with in additional inductor, having a first terminal electrically connected to the pad and the internal circuit and a second terminal electrically connected to an additional exit pad for electrostatic discharge pulses appearing at the pad.

11. An electrostatically protected circuit comprising:
    an internal circuit electrically connected to a pad;
    an additional pad;
    an ESD protector, including an electrostatic protection circuit in series with an inductor, the electrostatic protection circuit having a first terminal electrically connected to the additional pad and a second terminal electrically connected to an exit path for electrostatic discharge pulses appearing at the pad, and wherein the inductor is electrically connected to the electrostatic protection circuit between the pad and the additional pad, wherein the inductor comprises:
    a first bonding wire having first and second ends respectively electrically connected to the additional pad and to a package pin; and
    a second bonding wire having first and second ends respectively electrically connected t o an auxiliary pad and to the package pin; and
    an on-chip interconnect electrically connecting the first pad and the auxiliary pad.

* * * * *